United States Patent

Sayka et al.

Patent Number: 5,312,039
Date of Patent: May 17, 1994

[54] ELECTRO-OPTIC MONITOR FOR FLUID SPRAY PATTERN

[75] Inventors: Anthony Sayka; Allen Page, both of San Antonio, Tex.

[73] Assignee: VLSI Technology, Inc., San Jose, Calif.

[21] Appl. No.: 902,181

[22] Filed: Jun. 22, 1992

[51] Int. Cl.$^5$ .......................... B67D 5/00; B05B 17/00
[52] U.S. Cl. .......................... 239/1; 239/72; 118/688
[58] Field of Search .................. 239/63, 71, 73, 1, 72; 118/688, 691; 73/432.1, 865.9; 382/48, 1; 250/574

[56] References Cited

U.S. PATENT DOCUMENTS

| | | | |
|---|---|---|---|
| 3,777,173 | 12/1973 | Landrith | 118/691 X |
| 4,506,626 | 3/1985 | Schurman et al. | 118/691 X |
| 4,699,081 | 10/1987 | Mack | 118/691 |
| 4,700,870 | 10/1987 | Schleicher et al. | 118/688 X |
| 4,712,736 | 12/1987 | Bray et al. | 239/72 X |
| 4,804,996 | 2/1989 | Snelling | 118/688 X |
| 4,876,458 | 10/1989 | Takeda et al. | 250/574 |
| 4,883,019 | 11/1989 | Menjo et al. | 118/691 |
| 4,905,897 | 3/1990 | Rogers et al. | 239/72 X |

FOREIGN PATENT DOCUMENTS

| | | | |
|---|---|---|---|
| 144078 | 9/1980 | Fed. Rep. of Germany | 118/688 |
| 3438925 | 4/1986 | Fed. Rep. of Germany | 239/71 |

OTHER PUBLICATIONS

Masten, L. R., "Understanding Optronics," Texas Instrument Learning Center, 1981, pp. 3-18 to 3-19.
"Xerox Disclosure Journal" vol. 5, No. 6, p. 669, Nov./Dec. 1980.

Primary Examiner—Andres Kashnikow
Assistant Examiner—Lesley D. Morris
Attorney, Agent, or Firm—Hickman & Beyer

[57] ABSTRACT

Method and apparatus for monitoring the fluid spray pattern of fluid sprayed by a nozzle onto a semiconductor wafer during processing of the wafer. A light source is positioned to illuminate the fluid sprayed in a pattern P from the nozzle, and one or more photodetectors are positioned to receive light scattered by the fluid spray. Each photodetector develops an electrical signal in response to receipt of the scattered light, and these electrical signals are received and analyzed by a comparison means. One or more reference signals representing a desired fluid spray pattern $P_0$ is stored in the comparison means, and each electrical signal for the pattern P is compared with the corresponding reference signal for the pattern $P_0$ by the comparison means. If one or more signal for the pattern P differs substantially from the corresponding reference signal for the desired pattern $P_0$, an alarm may be generated and/or delivery of fluid by the nozzle may be terminated.

15 Claims, 1 Drawing Sheet

ELECTRO-OPTIC MONITOR FOR FLUID SPRAY PATTERN

BACKGROUND OF THE INVENTION

1. Field of the Invention

This invention relates to fabrication of integrated circuits on a semiconductor wafer, and more particularly to controlled application of fluids, such as photoresist developer fluids, to a semiconductor wafer surface.

2. Description of the Related Art

In semiconductor fabrication of integrated circuits (ICs), a workpiece, such as a semiconductor wafer, is often treated or sprayed with a fluid as a part of the fabrication process. For example, a surface of a semiconductor wafer can be coated with a photoresist material and cured, after which time the material can be selectively exposed to light or to a charged particle beam. The cured material can be immersed in a photoresist developer to develop and thus selectively expose portions of the wafer surface to produce a desired pattern. The selectively exposed portions can be subjected to chemical vapor deposition, chemical etching, ion implantation or some other semiconductor fabrication process. This process can produce a layer of a circuit or a resistive or conductive component for the IC.

In a similar manner, a liquid dielectric can be sprayed on a selected region of a semiconductor wafer to provide electrical insulation for subsequently deposited IC layers. A liquid or gaseous coating can be sprayed on a selected surface of a metal or plastic substrate for protective purposes. A photographic developer or fixer liquid can be sprayed on a light-sensitive surface of a substrate to develop or fix a previously exposed optical image. In any of these fabrication steps, it is important to apply the fluid as uniformly as possible to the surface or workpiece to help insure that chemical reaction or bonding of the fluid with the exposed surface is not affected by locally non-uniform concentrations of such fluid.

What is needed is an approach that allows monitoring of the spray pattern of a fluid being applied to a surface of a workpiece, to determine whether the fluid is being applied uniformly, or being applied in a selected non-uniform pattern. Preferably, this approach should provide information on the fluid spray pattern that aids in determining how, if at all, the spray pattern should be altered to provide more uniform (or selected non-uniform) application of the fluid to the chosen surface.

SUMMARY OF THE INVENTION

These needs are met by the invention, which in one embodiment provides: (1) a nozzle or other fluid delivery means to deliver a fluid in a fluid spray pattern P to the surface or workpiece; (2) a baseline or reference $P_0$ against which a fluid spray pattern P is to be compared; (3) a source of light, positioned to direct light toward the fluid spray pattern P so that the light is scattered, absorbed, or transmitted ("scattered") by fluid in the spray; (4) at least one photodetector, positioned adjacent to the volume occupied by the fluid spray, to receive light from the light source that has been scattered by fluid spray pattern P and to generate and issue an output electrical signal in response to receipt of this light; and (5) an apparatus that receives the electrical signal issued by the photodetector and that compares this signal with the reference pattern $P_0$.

The reference $P_0$ represents the desired or ideal fluid spray pattern for the spray pattern P, and if fluid spray pattern P differs substantially from the reference $P_0$, the fluid spray pattern P can be changed to bring the pattern P into closer resemblance to the reference $P_0$. If the patterns P differs from the reference $P_0$ by more than a selected quantitative threshold difference, an alarm may be generated and/or the fluid delivery system may be shut down for adjustment.

A preferred method performed according to the invention begins by providing a reference $P_0$, representing a desired or ideal fluid spray pattern, and one or more reference electrical signals corresponding to the reference $P_0$. A fluid spray pattern P is then illuminated with a light source, and the light is allowed to be scattered or absorbed ("scattered") by fluid in this spray pattern. The scattered light is received at one or more photodetectors positioned adjacent to the volume occupied by the fluid spray so that each photodetector generates and issues an electrical signal in response to receipt of such light. An electrical signal issued by each photodetector is then analyzed and compared with a corresponding reference electrical signal for the reference $P_0$.

Once an acceptable reference $P_0$ has been determined for a particular semiconductor fabrication step, this reference can be used for all subsequent process steps that require spraying of that fluid at any rate of delivery and over any region of a workpiece. The reference $P_0$ may be used for that liquid for a variety of processes, including: semiconductor wafer fabrication; chemical coating of metals, plastics and other substrates; and processing of previously exposed photographic images on light-sensitive substrates. A subsequent spray pattern P may be compared with the reference $P_0$, and a threshold may be chosen for a quantitatively determined "difference" between the subsequent spray pattern P and the reference $P_0$. This quantitative threshold difference may be adjusted to allow looser or tighter spray pattern matching, depending on the circumstances. However, the reference $P_0$ is unchanged and need only be determined once for that choice of fluid to be sprayed.

These and other advantages of the present invention will become apparent to those skilled in the art upon a reading of the following specification of the invention and a study of the several figures of the drawing.

DETAILED DESCRIPTION OF THE PREFERRED EMBODIMENTS

Figure 1:
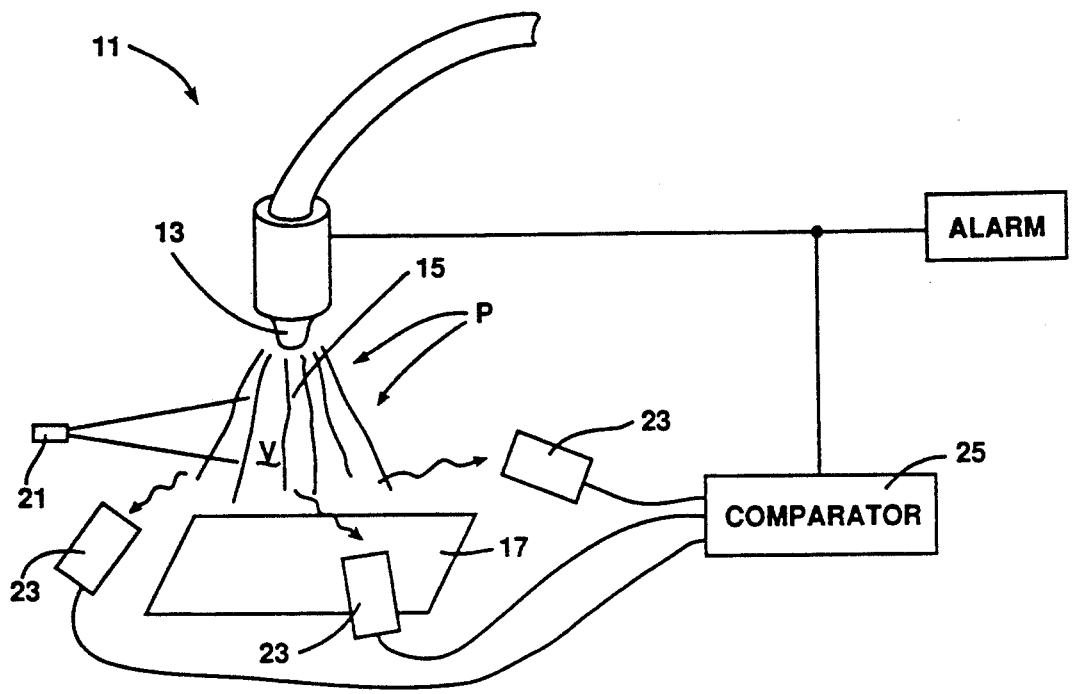
FIG. 1 is a perspective view of a first embodiment of the invention, wherein a baseline fluid spray pattern is used for comparison purposes.

FIG. 1 illustrates one embodiment 11 of the invention, in which a spray nozzle or other fluid delivery means 13 delivers a fluid 15 in a selected spray pattern P to an exposed surface or workpiece 17. If the fluid 15 being delivered is a photoresist developer liquid or a liquid dielectric for a semiconductor wafer, a substrate liquid or gaseous coating material, or a photographic developer or fixer liquid, it is desirable that the fluid be delivered as uniformly as possible to the surface or workpiece 17. A fluid 15 can be delivered according to an arbitrary or variable spray pattern P that varies from day to day, or even minute to minute. Thus, it is important to be able to monitor the extant spray pattern and to compare this extant spray pattern with a desired spray pattern for that fluid.

In a first embodiment, the fluid would be initially delivered, fluid delivery would then be terminated, and the coated surface would be tested to determined if the fluid delivery pattern is acceptable. Once a reference (fluid spray) pattern $P_0$ is obtained, one or more light sources 21, such as light emitting diodes (LEDs), electric lamps and other monochromatic and polychromatic sources of light, are positioned to illuminate the reference $P_0$ of the fluid 15 issuing from the nozzle 13. The scattered and/or absorbed and/or transmitted illumination (hereinafter referred to as "scattered" illumination for convenience) produced by the light source 21 is collected at one or more photodetectors 23 and analyzed by comparison apparatus 25 connected to the photodetector(s). The apparatus 25 may be a microprocessor, a specially configured circuit or other signal processing apparatus. This establishes a set of reference or baseline measurements against which future fluid deliveries will be compared. Alternatively, the reference pattern $P_0$ may be set at the factory, or resettable under user control.

Subsequent fluid delivery by the nozzle 13 will produce a spray pattern P of fluid 15. The spray pattern P is indirectly compared with the reference pattern $P_0$, by comparing the electrical signals generated at the photodetector(s) 23 by the scattered and/or absorbed light received at the photodetector(s) for the acceptable reference pattern $P_0$ and for the present fluid spray pattern P. Alternatively, the electrical signal generated at each photodetector 23 for the reference pattern $P_0$ may be held in the comparison apparatus 25 for comparison purposes.

The wavelength of the output light from the LEDs 21 is preferably matched to, or approximates, the wavelength of maximum sensitivity of the photodetectors 23. For example, the TIL81 photodetector from Texas Instruments has a maximum sensitivity at a wavelength $\lambda \approx 0.9$ $\mu$m, and typical GaAs semiconductor diodes and W light sources also have broadly defined peaks at this wavelength. The sensitivity of a photodetector is also sensitive to the angle at which incident light is received. For example, the TIL81 photodetector has a sharply defined maximum sensitivity for light arriving along its "optical axis". This sensitivity decreases sharply and monotonically as the light incidence angle, measured relative to this optical axis, increases. The sensitivity of the TIL81 at incidence angles $\theta=15°$ and at $\theta=30°$ is about 0.2 and 0.05, respectively, according to data presented by L. R. Masten et al in *Understanding Optronics*, Texas Instruments Learning Center, 1981, pp. 3-17 to 3-20. The full width at half maximum ("FWHM") for this detector is estimated to be less than 15°. This incidence angle sensitivity can be used to good advantage in the invention by: (1) choosing a photodetector with a FWHM of no more than a few degrees; and/or (2) masking the photodetector face so that only light with an incidence angle $\theta$ of a few degrees or less is accepted at, and registers a signal at, the photodetector. Alternatively, the light wavelength $\lambda$ may be chosen so that the fluid highly absorbs or highly scatters the light produced by the light source 21.

Figure 2:
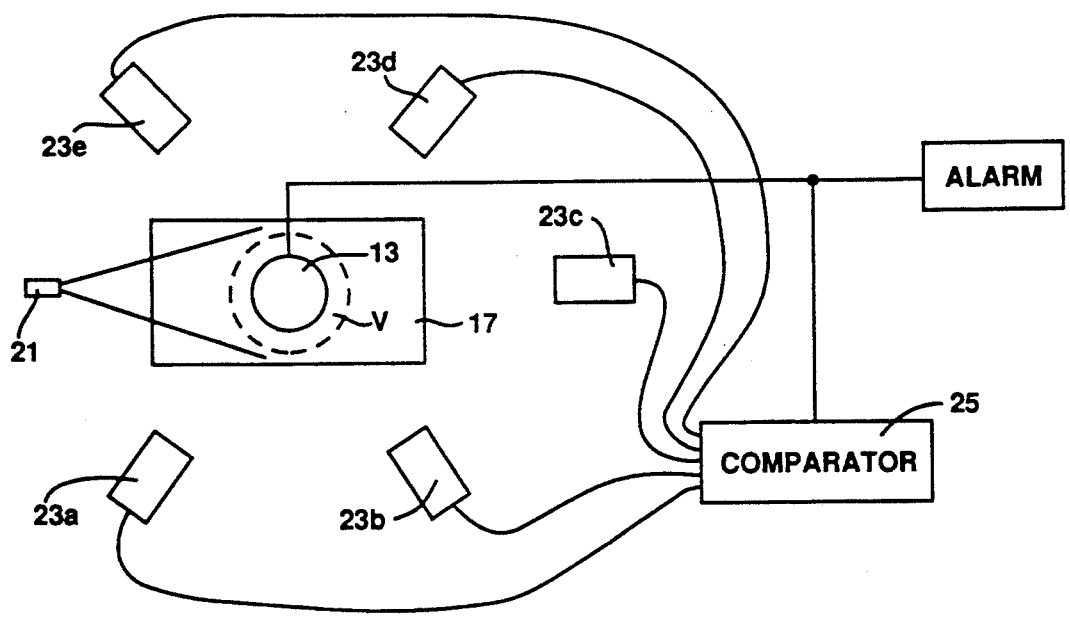
FIG. 2 is a top view of the embodiment of FIG. 1, illustrating possible placement of several photodetectors around the volume of the fluid spray pattern.

The photodector or plurality of photodetectors 23 is preferably positioned adjacent to the volume V occupied by the fluid spray pattern P as the fluid 15 issues from the nozzle 13, as illustrated in a top view of the invention in FIG. 2. Light from the source(s) 21 is then received, scattered by the fluid 15 in the spray pattern P, and a portion of this light is received by each photodetector 23a, 23b, 23c, 23d, 23e and analyzed by the comparison apparatus 25. Cross-correlations of these signals may also be analyzed, for comparison with the corresponding signals generated by the reference pattern $P_0$. Optionally, each photodetector signal and/or cross-correlation signal may be integrated over a suitable time interval $\Delta t$ (of the order of milliseconds to a few seconds)to compensate for the unavoidable presence of small scale randomness or fluctuations in the patterns $P_0$ and P themselves.

While this invention has been described in terms of a preferred embodiment, variation and modification may be made without departing from the scope of the invention. For example, the reference pattern $P_0$ for a desired or ideal fluid spray pattern can be pre-set when the computational apparatus is manufactured or assembled. Some applications only require use of a single photodetector.

It is therefore intended that the following appending claims be interpreted as including all such variations and modifications as fall within the true spirit and scope of the present invention.

What is claimed is:

1. A method of monitoring a fluid spray pattern of fluid sprayed from a nozzle, the method comprising the steps of:

illuminating a fluid spray pattern P with a light source such that light emitted by the light source is scattered by fluid in the spray pattern P;

detecting the light scattered by the fluid in the flowing fluid spray pattern P using a plurality of photodetectors positioned adjacent to the volume occupied by the fluid spray pattern P so that each of said photodetectors develops an electrical signal in response to receipt of scattered light prior to impact of said fluid on a surface; and analyzing the electrical signal issued by each of said photodetectors and comparing the electrical signals with corresponding reference signals that represent a desired fluid spray pattern $P_0$.

2. The method of claim 1, wherein said step of analyzing said electrical signals comprises determining quantitatively whether said fluid spray pattern P differs from the desired fluid spray pattern $P_0$.

3. The method of claim 1, further comprising the step of providing a signal perceptible by a human if said electrical signals developed by said fluid spray pattern P differs substantially from said reference signals.

4. The method of claim 1, where said step of illuminating said fluid spray pattern comprises providing a light source that emits light having at least one wavelength for which each of said photodetectors is sensitive.

5. The method of claim 1, further comprising the step of terminating delivery of said fluid sprayed from said nozzle if said electrical signals generated by said fluid spray pattern P differ substantially from said reference signals.

6. The method of claim 1, further comprising the step of averaging said electrical signals generated by said spray pattern P over a selected time interval before said electrical signals are compared with said reference signals.

7. The method of claim 1, wherein said reference signals are determined by illuminating a desired fluid spray pattern, detecting said scattered light at each photodetector, and storing said photodetector signals as said reference signals.

8. An apparatus for monitoring a fluid spray pattern of fluid sprayed from a nozzle, the apparatus comprising:
- a light source positioned to illuminate fluid sprayed by a nozzle in a pattern P so that light emitted by the light source is scattered by the fluid;
- a plurality of photodetectors positioned adjacent to the volume occupied by the fluid spray pattern P so that each photodetector develops an electrical signal in response to receipt of such light prior to impact of said fluid on a surface; and
- comparison means for comparing the electrical signals developed by each photodetector with reference signals that represent a desired fluid spray pattern $P_0$.

9. The apparatus of claim 8, wherein said comparison means determines quantitatively whether said fluid spray pattern P differs from the desired fluid spray pattern $P_0$.

10. The apparatus of claim 9, further comprising alarm means, connected to said comparison means, for issuing an alarm signal if said fluid spray pattern P is determined to differ from said desired fluid spray pattern $P_0$ by more than a selected threshold amount.

11. The apparatus of claim 8, further comprising control means, connected to said nozzle and to said comparison means, for terminating delivery of fluid from said nozzle if said fluid spray pattern P is determined to differ from said desired fluid spray pattern $P_0$ by more than a selected threshold amount.

12. The apparatus of claim 8, wherein said light source emits light having at least one wavelength to which said photodetectors are sensitive.

13. The apparatus of claim 8, wherein said comparison means averages said electrical signals developed by said photodetectors over a selected time interval before said electrical signals are compared with said reference signals.

14. A method of monitoring a fluid spray pattern of fluid sprayed from the nozzle, the method comprising:
- illuminating a fluid spray pattern P with a light source such that light emitted by said light source is scattered by fluid in the spray pattern P;
- detecting the light scattered by the fluid in the flowing spray pattern P by a photodetector positioned adjacent to the volume occupied by the fluid spray pattern P so that said photodetector develops an electrical signal in response to receipt of the scattered light prior to impact of said fluid on a surface; and
- analyzing said electrical signal issued by said photodetector and comparing said electrical signal with a corresponding reference signal that represents a desired fluid spray pattern $P_0$.

15. An apparatus for monitoring a fluid spray pattern of fluid sprayed from a nozzle, the apparatus comprising:
- a light source positioned to illuminate fluid sprayed by a nozzle in a fluid spray pattern P so that light emitted by the light source is scattered by the fluid;
- a photodetector positioned adjacent to the volume occupied by the fluid spray pattern P so that said photodetector develops an electrical signal in response to receipt of such light before said fluid impacts a surface; and
- comparison means for comparing said electrical signal issued by said photodetector and comparing said electrical signal with a corresponding reference signal that represents a desired fluid spray pattern $P_0$.

* * * * *